United States Patent
Brabec et al.

(10) Patent No.: US 8,975,512 B2
(45) Date of Patent: Mar. 10, 2015

(54) TANDEM PHOTOVOLTAIC CELLS

(71) Applicant: Merck Patent GmbH, Darmstadt (DE)

(72) Inventors: Christoph Brabec, Linz (AT); Russell Gaudiana, Lyndeborough, NH (US); Christoph Waldauf, Innsbruck (AT)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 13/920,486

(22) Filed: Jun. 18, 2013

(65) Prior Publication Data

US 2013/0276874 A1 Oct. 24, 2013

Related U.S. Application Data

(63) Continuation of application No. 11/643,271, filed on Dec. 21, 2006, now abandoned.

(60) Provisional application No. 60/752,608, filed on Dec. 21, 2005, provisional application No. 60/790,606, filed on Apr. 11, 2006, provisional application No. 60/792,485, filed on Apr. 17, 2006, provisional application No. 60/792,635, filed on Apr. 17, 2006, provisional application No. 60/793,442, filed on Apr. 20, 2006, provisional application No. 60/795,103, filed on Apr. 26, 2006, provisional application No. 60/797,881, filed on May 5, 2006, provisional application No. 60/798,258, filed on May 5, 2006.

(51) Int. Cl.
| | |
|---|---|
| *H01L 31/042* | (2014.01) |
| *H01L 51/42* | (2006.01) |
| *B82Y 10/00* | (2011.01) |
| *H01L 27/30* | (2006.01) |
| *H01L 31/0725* | (2012.01) |
| *H01L 51/00* | (2006.01) |
| *H01L 51/44* | (2006.01) |

(52) U.S. Cl.
CPC ............. *H01L 51/4253* (2013.01); *B82Y 10/00* (2013.01); *H01L 27/302* (2013.01); *H01L 51/4226* (2013.01); *H01L 31/0725* (2013.01); *H01L 51/0036* (2013.01); *H01L 51/0037* (2013.01); *H01L 51/0039* (2013.01); *H01L 51/0043* (2013.01); *H01L 51/0047* (2013.01); *H01L 51/441* (2013.01); *H01L 2251/308* (2013.01); *Y02E 10/549* (2013.01)
USPC ........................... 136/263; 136/243; 136/252

(58) Field of Classification Search
CPC ........ H01L 31/00–31/208; Y02E 10/50–10/60
USPC .................................................. 136/243–265
See application file for complete search history.

(56) References Cited

U.S. PATENT DOCUMENTS

| 4,292,092 A | 9/1981 | Hanak |
| 4,416,959 A | 11/1983 | Skotheim |

(Continued)

FOREIGN PATENT DOCUMENTS

| DE | 31 21 350 | 7/1982 |
| DE | 103 26 547 | 1/2005 |

(Continued)

OTHER PUBLICATIONS

Bjorstrom et al., "Multilayer formation in spin-coated thin films of low-bandgap polyfluorene:PCBM blends," J. Phys. Condens. Matter 17:L529-L534, 2005.

(Continued)

*Primary Examiner* — Bach Dinh
(74) *Attorney, Agent, or Firm* — Bowditch & Dewey, LLP; Roger P. Zimmerman

(57) ABSTRACT

Tandem photovoltaic cells having a recombination layer, as well as related systems, methods, and components, are disclosed.

22 Claims, 3 Drawing Sheets

(56) References Cited

U.S. PATENT DOCUMENTS

| | | |
|---|---|---|
| 4,574,160 A | 3/1986 | Cull et al. |
| 4,639,328 A | 1/1987 | Krause et al. |
| 4,686,323 A | 8/1987 | Biter et al. |
| 4,746,618 A | 5/1988 | Nath et al. |
| 4,795,687 A | 1/1989 | Suzuki et al. |
| 4,913,744 A | 4/1990 | Hoegl et al. |
| 4,948,436 A | 8/1990 | Juergens |
| 5,071,490 A | 12/1991 | Yokota et al. |
| 5,221,363 A | 6/1993 | Gillard |
| 5,274,058 A | 12/1993 | Ferraris et al. |
| 5,510,438 A | 4/1996 | Ferraris et al. |
| 5,536,808 A | 7/1996 | Curtis et al. |
| 5,708,130 A | 1/1998 | Woo et al. |
| 6,109,330 A | 8/2000 | Crisp |
| 6,132,585 A | 10/2000 | Midorikawa et al. |
| 6,188,175 B1 | 2/2001 | May et al. |
| 6,198,091 B1 | 3/2001 | Forrest et al. |
| 6,198,092 B1 | 3/2001 | Bulovic et al. |
| 6,239,355 B1 | 5/2001 | Salafsky |
| 6,278,055 B1 | 8/2001 | Forrest et al. |
| 6,297,495 B1 | 10/2001 | Bulovic et al. |
| 6,333,458 B1 | 12/2001 | Forrest et al. |
| 6,352,777 B1 | 3/2002 | Bulovic et al. |
| 6,353,083 B1 | 3/2002 | Inbasekaran et al. |
| 6,399,224 B1 | 6/2002 | Li |
| 6,440,769 B2 | 8/2002 | Peumans et al. |
| 6,451,415 B1 | 9/2002 | Forrest et al. |
| 6,464,762 B1 | 10/2002 | Arao |
| 6,580,027 B2 | 6/2003 | Forrest et al. |
| 6,657,378 B2 | 12/2003 | Forrest et al. |
| 6,772,817 B2 | 8/2004 | Lai et al. |
| 6,818,260 B2 | 11/2004 | Farrand et al. |
| 6,864,333 B2 | 3/2005 | Dall'Occo et al. |
| 7,095,044 B2 | 8/2006 | Brown et al. |
| 7,105,237 B2 | 9/2006 | Sotzing |
| 7,196,366 B2 | 3/2007 | Forrest et al. |
| 7,309,833 B2 | 12/2007 | Robeson et al. |
| 7,368,510 B2 | 5/2008 | Lee et al. |
| 7,375,370 B2 | 5/2008 | Forrest et al. |
| 7,405,775 B2 | 7/2008 | Nilsson |
| 2002/0040728 A1 | 4/2002 | Yoshikawa |
| 2002/0050289 A1 | 5/2002 | Wada et al. |
| 2002/0105005 A1 | 8/2002 | Seo et al. |
| 2003/0008172 A1 | 1/2003 | Leclerc et al. |
| 2003/0023029 A1 | 1/2003 | Wang et al. |
| 2003/0036612 A1 | 2/2003 | Nifant'ev et al. |
| 2003/0042471 A1 | 3/2003 | Giles et al. |
| 2003/0102024 A1 | 6/2003 | Zeira et al. |
| 2003/0127967 A1 | 7/2003 | Tsutsui et al. |
| 2003/0159729 A1 | 8/2003 | Shaheen et al. |
| 2003/0175411 A1 | 9/2003 | Kodas et al. |
| 2003/0188777 A1 | 10/2003 | Gaudiana et al. |
| 2003/0189402 A1 | 10/2003 | Gaudiana et al. |
| 2003/0230335 A1 | 12/2003 | Tsukahara |
| 2004/0118448 A1 | 6/2004 | Scher et al. |
| 2004/0187911 A1 | 9/2004 | Gaudiana et al. |
| 2004/0192871 A1 | 9/2004 | Wang et al. |
| 2004/0201018 A1 | 10/2004 | Yamahara et al. |
| 2004/0256615 A1 | 12/2004 | Sirringhaus et al. |
| 2005/0022865 A1 | 2/2005 | Robeson et al. |
| 2005/0124784 A1 | 6/2005 | Sotzing |
| 2005/0145972 A1 | 7/2005 | Fukuda et al. |
| 2005/0194038 A1 | 9/2005 | Brabec et al. |
| 2005/0224905 A1 | 10/2005 | Forrest et al. |
| 2006/0022192 A1 | 2/2006 | Brabec et al. |
| 2006/0027834 A1 | 2/2006 | Forrest et al. |
| 2006/0076050 A1 | 4/2006 | Williams et al. |
| 2006/0141662 A1 | 6/2006 | Brabec et al. |
| 2006/0147748 A1 | 7/2006 | Ko |
| 2006/0155106 A1 | 7/2006 | Roberts et al. |
| 2007/0014939 A1 | 1/2007 | Gaudiana et al. |
| 2007/0017571 A1 | 1/2007 | Gaudiana et al. |
| 2007/0020526 A1 | 1/2007 | Gaudiana et al. |
| 2007/0120045 A1 | 5/2007 | Yokoyama |
| 2007/0158620 A1 | 7/2007 | Gaudiana et al. |
| 2007/0181179 A1 | 8/2007 | Brabec et al. |
| 2007/0193621 A1 | 8/2007 | Brabec et al. |
| 2008/0053518 A1 | 3/2008 | Change et al. |
| 2008/0164460 A1 | 7/2008 | Oyamada et al. |
| 2008/0264488 A1 | 10/2008 | Balasubramanian |

FOREIGN PATENT DOCUMENTS

| | | |
|---|---|---|
| DE | 69330835 | 2/2007 |
| EP | 0 251 598 | 1/1988 |
| EP | 1 065 725 | 1/2001 |
| EP | 1 318 553 | 6/2003 |
| EP | 1507298 | 2/2005 |
| EP | 1562154 | 8/2005 |
| JP | 04-92376 | 7/1992 |
| JP | 2002-141524 | 5/2002 |
| JP | 03-073382 | 3/2003 |
| JP | 2003-515933 | 5/2003 |
| JP | 2003-264085 | 9/2003 |
| JP | 04-534863 | 6/2004 |
| JP | 05-011841 | 1/2005 |
| JP | 06-166746 | 6/2006 |
| JP | 06-278682 | 10/2006 |
| JP | 2001-060707 | 3/2011 |
| KR | 100685796 | 2/2007 |
| WO | WO 93/05077 | 3/1993 |
| WO | WO 94/14199 | 6/1994 |
| WO | WO 97/05184 | 2/1997 |
| WO | 00/22682 | 4/2000 |
| WO | WO 00/46321 | 8/2000 |
| WO | WO 01/39276 | 5/2001 |
| WO | 00/11725 | 3/2002 |
| WO | WO 02/059121 | 8/2002 |
| WO | 02/101838 | 12/2002 |
| WO | WO 03/065462 | 8/2003 |
| WO | WO 2004/042824 | 5/2004 |
| WO | WO 2004/051756 | 6/2004 |
| WO | WO 2005/092947 | 10/2005 |
| WO | WO 2005/111045 | 11/2005 |
| WO | WO 2007/011739 | 1/2007 |
| WO | WO2007022226 | 2/2007 |
| WO | WO/2007/076427 | 7/2007 |
| WO | WO 2007/121252 | 10/2007 |
| WO | WO 2007/133705 | 11/2007 |
| WO | WO 2007/145482 | 12/2007 |
| WO | WO 2008/000664 | 1/2008 |
| WO | WO 2010/008672 | 1/2010 |

OTHER PUBLICATIONS

Greenham et al., "Charge separation and transport in conjugated polymer/cadmium selenide nanocrystal composites studied by photoluminescence quenching and photoconductivity," Synthetic Metals, 84:545-546, 1997.

Yakimov et al., "High photovoltage multiple-heterojunction organic solar cells incorporating interfacial metallic nanoclusters," Applied Physics Letters, vol. 80, No. 9, Mar. 2002.

Hiramoto et al., "Effect of Thin Gold Interstitial-layer on the Photovoltaic Properties of Tandem Organic Solar Cell," Chemistry Letters, the Chemistry Society of Japan, pp. 327-330, 1990.

Kong et al., "Single-Walled Carbon Nanotube Gold Nanohybrids: Application in Highly Effective Transparent and Conductive Films," J. Phys. Chem. C2007, 111, p. 8377-8382.

Ahmed, et al., "Benzobisthiazole-Thiophene Copolymer Semiconductors: Synthesis, Enhanced Stability, Field-Effect Transistors, and Efficient Solar Cells," Macromolecules 2009, 42, 8615-8618.

Ando et al., "Characterization and Field-Effect Transistor Performance of Heterocyclic Oligomers Containing a Thiazolothiazole Unit," Chemistry Letter vol. 33, No. 9, 1170-1171 (2004).

Barbarella et al., "Oligothiophene-S, S dioxides: a New Class of Thiophene based Materials," Journal of Organic Chemistry, Optical Materials 9 (1998) 43-45.

Chen, et al., Polymer solar cells with enhanced open-circuit voltage and efficiency, Nature Photonics, vol. 3, 649-653, Nov. 2009.

European Search Report dated Nov. 10, 2010, Application No. 10177632.6.

(56) References Cited

OTHER PUBLICATIONS

Gao, et al., "Efficient photodetectors and photovoltaic cells from composites of fullerenes and conjugated polymers: photoinduced electron transfer" Synthetic Metals 84 (1997) 979-980.
Niu, Applied Physics Letters, 2003, vol. 82, No. 13, 2163-2165.
Jianggeng Xue, et al., "A Hybrid Planar-Mixed Molecular Heterojunction Photovoltaic Cell," Adv. Mater. 2005, 17, No. 1 Jan. 6.
Pankaj Kumar, et al., "Effect of Active Layer Thickness on Open Circuit Voltage in Organic Photovoltaic Devices," Japanese Journal of Applied Physics 48 (2009) 121501.
European Search Report dated Feb. 24, 2011, Application No. 10177632.6.
Hou, et al., "Synthesis, Characterization, and Photovoltaic Properties of a Low Band Gap Polymer Based on Silole-Containing Polythiophenes and 2, 1, 3-Benzothiadiazole," J. Am. Chem. Soc. 2008, 130, 16144-16145.
Hou, et al., "Bandgap and Molecular Energy Level Control of Conjugated Polymer Photovoltaic Materials Based on Benzo[1,2-$b$:4,4-$b'$]dithophene" Macromolecules 2008, 41, 6012-6018.
International Preliminary Report on Patentability dated Feb. 8, 2011 issued in PCT/US2009/049701.
International Search Report dated Apr. 3, 2010, PCT/US2010/026222.
Jayakanna et al., "Synthesis and Structure-Property Relationship of New Donor-Accepted-Type Conjugated Monomers on the Basis of Thiophene and Benzothiadiazole," Journal of Polymer Science Part A:Polymer Chemistry, vol. 40, 251-261 (2002).
Kunai et al., "Synthesis and properties of silicon-bridged bithiophenes and application to EL devices," Synthetic Metals, Elsevier Sequoia Lausanne, CH, vol. 137, No. 1-3, Jan. 1, 2003, pp. 1007-1008.
Li, et al., "High-efficiency solution processable polymer photovoltaic cells by self-organization of polymer blends," Nature Materials, vol. 4, 864-868, Nov. 2005.
Liu et al., "Efficient green-light-emitting diodes from silole-containing copolymers," 15, 3496-3500 (2003).
Maksudul, et al., "Polybenzobisazoles Are Effective Electron Transport Materials for Improving the Performance and Stability of Polymer Light-Emitting Diodes," Chem. Mater. 2002, 14, 4775-4780.
Mike, et al., "Facile Synthesis of 2, 6-Disubstituted Benzobisthiazoles: Functional Monomers for the Design of Organic Semiconductors," J. Org. Chem. 2010, 75, 495-497.
Mike, et al., An Efficient Synthesis and Characterization of Dialkoxy Substituted Poly(phenylenevinylene) Benzobisoxazoles, Rapid Communication, J. Polym. Sci. Part A:Polym. Chem.: vol. 48, 1456-1460 (2010).
Osahen et al., "Electroactive and Photactive Rod-Coil Copolymers: Design, Synthesis, and Supramolecular Regulation of Photophysical Properties," J. Am. Chem. SOC. 1995, 117, 7389-7398.
Osaka, et al., "Novel Thiophene-Thiazolothiazole Copolymers for Organic Field-Effect Transistors," Adv. Mater. 2007, 19, 4160-4165.
Osaka et al., "High-Lamellar Ordering and Amorphous-Like π-Network in Short-Chain Thiazolothiazole-Thiophene Copolymers Lead to High Mobilities," J. Am. Chem. Soc. 2009, 131, 2521-2529.
Peet et al., "Efficiency enhancement in low-bandgap polymer solar cells by processing with alkane dithiols," Nat. Mat., 6:497-500, 2007.
Peng et al., "Synthesis and electroluminescent properties of copolymers based on fluorine and 2,5-di(2-hexyloxpheny)thiazologhiazole," Macromolecules 38, 7292-7298 (2005).
Shrotriya, V., "Plastic Solar Cells," Organic Semiconductor Conference, 1-33 (2009).
So, et al., "Synthesis and Photophysical Properties of Some Benzoxazole and Benzothiazole Compounds," Macromolecules 1996, 29, 2784-2795.
Supplemental European Search Report dated Mar. 4, 2011, Application No. 07872313.7.
Supplemental European Search Report dated Mar. 4, 2011, Application No. 06787321.6.

Zhang et al., "Polymer Solar Cells Based on a Low-Bandgap Fluorene Copolymer and a Fullerene Derivative with Photocurrent Extended to 850 nm," Adv. Funct. Mater. 2005, No. 15, 745-750.
P. Peumans, "Efficient photon harvesting at high optical intensities in ultrathin organic double-heterostructure photovoltaic diodes," Applied Physics Letters, vol. 76, No. 19, May 8, 2000.
Wenping Hu et al., "Structure and thickness dependence of p-n heterojunction solar cells based on copper hthalocyanine and perylene pigments," J. Phys. D: Appl. Phy. 37 (2004) 1434-1438.
Benoit Brousse et al., Vapour deposited solar cells based on CuPc-C60 single heterojunction: optimization of the deposition process, Synthetic Metals 147 (2004) 293-298.
Ando et al, "Synthesis, physical properties, and field effect transistors of novel thiophene/thiazolothiazole co-oligomers," J. Mater. Chem., vol. 14, 1787-1790, 2004.
Asawapiron et al., "Dialkylcyclopentadithiophene Polymers and Copolymers," Macromolecular Rapid Communications, 22:746-749, 2001.
Bakhshi et al., "Strategies for Molecular Designing of Novel Low-Band-Gap Electrically Conducting Polymers," Applied Biochemistry and Biotechnology, 96:125-133, 2001.
Bakhshi et al., "Electronic Structures of Donor-Acceptor Polymers Based on Polythiophene, Polyfuran and Polypyrrole," Molecular Engineering, 6:239-248, 1996.
Bakhshi et al., "*Ab initio* study of the electronic structures and conduction properties of some donor-acceptor polymers and their copolymers," Journal of Chemical Physics, 119:13159-13169, 2003.
Baumgartner, "π-Conjugated Heterocyclic fused Bithiophene Materials," J. Inorganic and Organometallic Polymers and Materials, 15(4):389-409, 2005.
Berlin et al., "Self-assembly of mono- and multilayers of polyconjugated conducting polymers," Macromolecular Rapid Communications, 21:301-318, 2000.
Berlin et al., "Thiophene/Cyclopentadiene Regular Copolymers from Electrochemical Oxidation of Dithienylcyclopentadienes," Macromolecular Chemistry and Physics, 203:1228-1237, 2002.
Coppo et al., "Cyclopentadithiophene based electroactive materials," J. Mater. Chem., 15:1123-1133, 2005.
Coppo et al., "Investigation of the electronic properties of cyclopentadithiophene polymers and copolymers," Mat. Res. Soc. Symp. Proc., 771:L4.9.1-L4.9.4, 2003.
Coppo et al., "New routes to poly(4,4-dialkylcyclopentadithiophene polymers and copolymers," Journal of Chemical Physics, 119:13159-13169, 2003.
Coppo et al., "Synthesis, solid state structure and polymerization of a fully planar cyclopentadithiophene," Chem. Commun., 2548-2549, 2003.
Coppo et al., "Synthetic Routes to Solution-Processable Polycyclopentadithiophenes," Macromolecules, 35:2705-2711, 2003.
Cravino et al., "Nanostructured Bipolar Organic Polymers," Encyclopedia of Nanoscience and Nanotechnology, 7:615-628.
Cravino et al., "Double-cable polymers for fullerene based organic optoelectronic applications," J. Mater. Chem., 12:1931-1943, 2002.
Dai, "Conjugated and Fullerene-Containing Polymers for Electronic and Photonic Applications; Advanced Syntheses and Microlithographic Fabrications," Journal of Macromolecular Science, Part C-Reviews in Macromolecular Chemistry and Physics, 39:273-387, 1999.
Gadisa et al., "Improvements of fill factor in solar cells based on blends of polyfluorene copolymers as electron donors," Thin Solid Films, 515:3126-3131, (2007).
Huang et al., "In-situ conductivity of a low band-gap conducting polymer. Measurement of intrinsic Conductivity," Acta Polymerica, vol. 48(10), (1997).
Huang et al., "A Donor-Accepted Conducting Copolymer with a Very Low Band Gap and High Intrinsic Conductivity," Chem. Mater., vol. 10, No. 8, pp. 2212-2216 (1998).
Huang et al., "Oxygen-Modified Poly(4-dicyanomethylene-4H-cyclopenta[2, 1-b; 3, 4-b]dithiophene: A Tunable Low Band Gap Polymer," Chem. Mater., vol. 11, No. 6, pp. 1541-1545, (1999).

(56) References Cited

OTHER PUBLICATIONS

Jespersen et al., "The electronic states of polyfluorene copolymers with alternating donor-acceptor units," J. Chem. Phy., 121(24): 12613-12617, 2004.
Kim et al., "Influence of electron-donating polymer addition on the performance of polymer solar cells," J.Phys.D.: Appl. Phys., 41:1-5 (2008).
Ko et al., "Electrochemistry and electrochromism of a poly(cyclopentadithiphene) derivative with a viologa pendant," Electrochimica Acta. vol. 48, pp. 4127-4315, (2003).
Kunigi et al., "Charge transport in a regioregular poly(3-octylthiophene) film," J. Mater. Chem., 10:2673-2677, 2000.
Larmat et al., "Comparative Reactivity of Thiophene and 3,4-(Ethylenedioxy) thiophene as Terminal Electropolymerizable Units in Bis-Heterocycle Arylenes," Journal of Polymer Science: Part A: Polymer Chemistry, 35:3627-3636, 1997.
Muhlbacher et al., "High Photovoltaic Performance of a Low-Bandgap Polymer," Adv. Mater., 18:2884-2889, 2006.
Ohshita et al., "Synthesis of Polymers Composed of Alternating Diphenylenedithienosilole and Diethynylenesilyene Units and Their Applications to Hole Transport in Double Layer EL Devices," Macromolecules, vol. 33, pp. 8890-8893, 2000.
Plater et al., "Cyclopenta-1, 2, 3-dithiazoles and related compounds." J. Chem. Soc., Perkin Trans. 1, Issue 7, 769-774, 1993. Abstract.
Prato, "Fullerene Materials," Topics in Current Chemistry, 199:173-187, 1999.
Roncali, "Linear π-conjugated systems with tailored electronic properties," Annu. Rep. Prog. Chem., Sect. C., 95:47-88, 1999.
Roncali, "Linear π-conjugated systems derivatized with $C_{60}$-fullerene as molecular heterojunctions for organic photovoltaics," Chem. Soc. Rev., 34:483-495, 2005.
Scherf et al., "Semiconducting Polyfluorenes—Towards Reliable Structure—Property Relationships," Advanced Materials, 14:477-487, 2002.
Sensfuss et al., "Characterization of potential donor acceptor pairs for polymer solar cells by ESR, optical and electrochemical investigations," vol. 5215, Proc of SPIE 129-140, 2004.
Subramanian et al., "Trends in Geometric and Electronic Properties of Thiophene- and Cyclopentadiene-Based Polymers," International Journal of Quantum Chemistry, 66:229-240, 1998.
Usta et al., "Dithiernsilole- and Dibenzosilole- Thiophene Copolymers as Semiconductors for Organic Thin-Film Transistors," J. Amer. Chem., 128:9034-9035, 2006.
Wang et al., "Conjugated Fluorene and Silole Copolymers: Synthesis, Characterization, Electronic Transition, Light Emission, Photovoltaic Cell, and Field Effect Hole Mobility," Macromolecules, 38:2253-2260, 2005.
Winder et al., "Sensitization of low bandgap polymer bulk heterojunction solar cells," Thin Solid Films, 403-404:373-379, (2002).
Wong et al., "Efficient photovoltaic cells with wide photosensitization range fabricated from rhenium benzathiazole complexes," App. Phys. Letters, 90:1-3, (2007).
Wu et al., "Low band gap-conjugated polymer derivatives," Synthetic Metals, vol. 155, pp. 618-622 (2005).
Yonezawa et al., "preparation and properties of oligomers containing cyclopentadithiophene," Synthetic Metals, 119:99-100, 2001.
Yoon et al., "Organic Thin-Film Transistors Based on Carbonyl-Functionalized Quaterthiophenes: High Mobility N-Channel Semiconductors and Ambipolar Transport," J.Am.Chem.Soc. vol. 127, pp. 1348-1349 (2005).
Zotti et al., "Polymers, Dimers and Radical Cations from Electrochemical Oxidation of Interring-Bridged Thiophene and Thiophene-Phenylene Tetramers," Macromolecular Chemistry and Physics, 202: 3049-3056, 2001.
Zotti et al., "Novel, Highly Conducting , and Soluble Polymers from Anodic Coupling of Alkyl-Substituted Cyclopentadithiophene Monomers," Macromolecules, 27:1938-1942, 1994.
Zhu et al., "Panchromatic Conjugated Polymers Containing Alternation Donor/Acceptor Units for Photovoltaic Applications," 40:1981-1986, 2007.
Dreschel et al., "High efficiency organic solar cells based on single or multiple PIN structures," Thin Solid Films, vol. 451-452: 515-517, 2004.
Hiramoto et al., "Design of nanostructures for photoelectric conversion using an organic vertical superlattice," Appl. Phys. Letters, 88:213105, 2006.
Takamoto et al., "Two Terminal Monolithic Ino.5Gao.5P/GaAs Tandem Solar Cells with a High Conversion Efficiency of Over 30%" Jap.J.Appl.Physics, 36(10):6215-6220.
Umeda et al., "Fabrication of Interpenetrating Semilayered Structure of Conducting Polymer and Fullerene by Solvent Corrosion Method and Its Photovoltaic Properties," Jap.J.Appl.Physics, 44(6A):4155-1460, 2005.
Yamaguchi et al., "Multi-junction III-V solar cells: current status and future potential," Solar Energy, 79(1):78-85, 2005.
Xue et al., "Asymmetric tandem organic photovoltaic cells with hybrid planar-mixed molecular heterojunctions," Appl. Phys. Letters, 85(23):5757-5759, 2004.
Roman et al., "High Quantum Efficiency Polythiophone/C60 Photodiodes," Adv. Mat., 10:774-777, 1998.
Swager et al., "The molecular wire approach to sensory signal amplifiers," Acc. Chem. Res., 1998, 31, 201-207.
Van Duren, "R.A.J. Low-bandgap Polymer Photovoltaic Cells," Synthetic Metals, 121:1587-1588, 2001.
Zhou et al., "Fluorene based low band gap copolymers for photovoltaic devices," Applied Physics Letters, vol. 84, No. 10, 1653-1655, Mar. 8, 2004.
Liao et al., "Photovoltaic Dithienosilole-Containing Polymers," Macromolecules, vol. 40, pp. 9406-9412 (2007).
A.C. Arias et al., "Vertically segregated polymer-blend photovoltaic thin-film structures through surface-mediated solution processing," Applied Physics Letters, vol. 80, No. 10, Mar. 11, 2002.
Anthony M. Higgins et al., "Surface segregation and self-stratification in blends of spin-cast polyfluorene derivatives," J. Phys. Condens. Matter 17 (2005) 1319-1328.
Hwajeong Kim et al., "Distinct Annealing Temperature in Polymer:Fullerene:Polymer Ternary Blend Solar Cells," J. Phys. Chem. C, 2009, 113(4), 1620-1623 DOI: 10.1021/jp809589n, Publication Date (Web) Jan. 5, 2009.
Hu and Matsumura, "Structure and thickness dependence of p-n heterojunction solar cells based on copper phthalocyanine and perylene pigments," Institute of Physics Publishing Journal of Physics D: Applied Physics, J.Phys.D:Appl. Phys., 37:1434-1438 (2004).

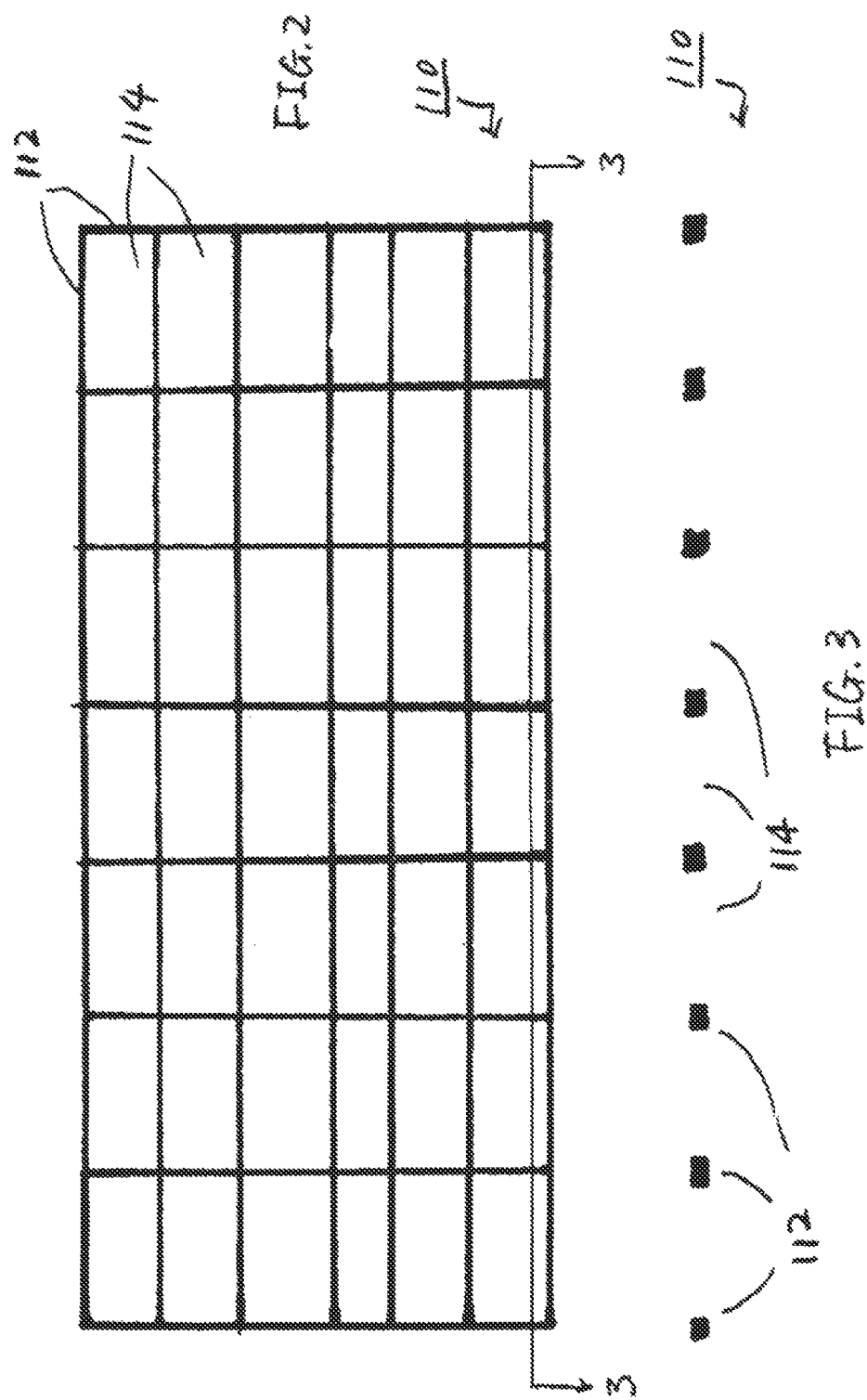

TANDEM PHOTOVOLTAIC CELLS

CROSS REFERENCE TO RELATED APPLICATIONS

This application is a continuation of U.S. patent application Ser. No. 11/643,271, filed Dec. 21, 2006, and pursuant to 35 U.S.C. §119(e), this application claims priority to U.S. Provisional Application Ser. No. 60/752,608, filed Dec. 21, 2005, U.S. Provisional Application Ser. No. 60/790,606, filed Apr. 11, 2006, U.S. Provisional Application Ser. No. 60/792,485, filed Apr. 17, 2006, U.S. Provisional Application Ser. No. 60/792,635, filed Apr. 17, 2006, U.S. Provisional Application Ser. No. 60/793,442, filed Apr. 20, 2006, U.S. Provisional Application Ser. No. 60/795,103, filed Apr. 26, 2006, U.S. Provisional Application Ser. No. 60/797,881, filed May 5, 2006, and U.S. Provisional Application Ser. No. 60/798,258, filed May 5, 2006, the contents of all of which are hereby incorporated by reference.

TECHNICAL FIELD

The invention relates to tandem photovoltaic cells having a recombination layer, as well as related systems, methods, and components.

BACKGROUND

Photovoltaic cells are commonly used to transfer energy in the form of light into energy in the form of electricity. A typical photovoltaic cell includes a photoactive material disposed between two electrodes. Generally, light passes through one or both of the electrodes to interact with the photoactive material to generate electricity. As a result, the ability of one or both of the electrodes to transmit light (e.g., light at one or more wavelengths absorbed by a photoactive material) can limit the overall efficiency of a photovoltaic cell. In many photovoltaic cells, a film of semiconductive material (e.g., indium tin oxide) is used to form the electrode(s) through which light passes because, although the semiconductive material may have a lower electrical conductivity than electrically conductive materials, the semiconductive material can transmit more light than many electrically conductive materials.

There is an increasing interest in the development of photovoltaic technology due primarily to a desire to reduce consumption of and dependency on fossil fuel-based energy sources. Photovoltaic technology is also viewed by many as being an environmentally friendly energy technology. However, for photovoltaic technology to be a commercially feasible energy technology, the material and manufacturing costs of a photovoltaic system (a system that uses one or more photovoltaic cells to convert light to electrical energy) should be recoverable over some reasonable time frame. But, in some instances the costs (e.g., due to materials and/or manufacture) associated with practically designed photovoltaic systems have restricted their availability and use.

SUMMARY

The invention relates to tandem photovoltaic cells having a recombination layer, as well as related systems, methods, and components.

In one aspect, this invention features a system that includes first and second electrodes, a recombination layer between the first and second electrodes, a first photoactive layer between the first electrode and the recombination layer, and a second photoactive layer between the second electrode and the recombination layer. The recombination layer includes a semiconductor material. The system is configured as a photovoltaic system.

In another aspect, this invention features a system that include first and second electrodes, first and second photoactive layers between the first and second electrodes, and a third layer between the first and second photoactive layers. The first photoactive layer includes a first semiconductor material and the second photoactive layer includes a second semiconductor material. The third layer includes a third semiconductor material different from the first or second semiconductor material. The system is configured as a photovoltaic system.

In another aspect, this invention features a system that includes first and second electrodes, first and second photoactive layers between the first and second electrodes, a third layer including an n-type semiconductor material, and a fourth layer include an p-type semiconductor material. The first photoactive layer is between the first electrode and the third layer, which is between the first and second photoactive layers. The second photoactive layer is between the second electrode and the fourth layer, which is between the second photoactive layer and the third layer. The system is configured as a photovoltaic system.

In another aspect, this invention features a system that includes first and second electrodes, a recombination layer between the first and second electrodes, a first photoactive layer between the first electrode and the recombination layer, and a second photoactive layer between the second electrode and the recombination layer. At least one of the first and second electrodes includes a mesh electrode. The recombination layer includes a semiconductor material. The system is configured as a photovoltaic system.

In still another aspect, this invention features a method that includes preparing a photovoltaic system having a recombination layer by a roll-to-roll process. Embodiments can include one or more of the following features.

In some embodiments, the semiconductor material in the recombination layer includes a p-type semiconductor material and an n-type semiconductor material.

In some embodiments, the p-type semiconductor material includes a polymer selected from the group consisting of polythiophenes (e.g., poly(3,4-ethylene dioxythiophene) (PEDOT)), polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxalines, polybenzoisothiazoles, polybenzothiazoles, polythienothiophenes, poly(thienothiophene oxide)s, polydithienothiophenes, poly(dithienothiophene oxide)s, polytetrahydroisoindoles, and copolymers thereof.

In some embodiments, the p-type semiconductor material includes a metal oxide. For example, the metal oxide can include an oxide selected from the group consisting of copper oxides, strontium copper oxides, and strontium titanium oxides. In certain embodiments, the p-type semiconductor material includes a p-doped metal oxide (e.g., p-doped zinc oxides or p-doped titanium oxides).

In some embodiments, the n-type semiconductor material includes a metal oxide. For example, the metal oxide can include an oxide selected from the group consisting of titanium oxides, zinc oxides, oxides, molybdenum oxides, and combinations thereof. In other embodiments, the n-type semiconductor material includes a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof.

In some embodiments, the p-type and n-type semiconductor materials are blended into one layer.

In some embodiments, the recombination layer includes two layers, one layer including the p-type semiconductor material and the other layer including the n-type semiconductor material.

In some embodiments, the first or second photoactive layer includes an electron donor material and an electron acceptor material.

In some embodiments, the electron donor material includes a polymer selected from the group consisting of polythiophenes, polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxaline, polyzoisothiazole, benzoisothiazole, polybenzothiazole, polythienothiophene, poly(thienothiophene oxide), polydithienothiophene, poly(dithienothiophene oxide)s, polytetrahydroisoindoles, and copolymers thereof. For example, the electron donor material can include a polymer selected from the group consisting of polythiophenes (e.g., poly(3-hexylthiophene) (P3HT)), polycyclopentadithiophenes (e.g., poly(cyclopentadithiophene-co-benzothiadiazole)), and copolymers thereof.

In some embodiments, the electron acceptor material includes a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof. For example, the electron acceptor material can include a substituted fullerene (e.g., C61-phenyl-butyric acid methyl ester (PCBM)).

In some embodiments, the first photoactive layer has a first band gap and the second photoactive layer has a second band gap different from the first band gap.

In some embodiments, the system further includes a hole carrier layer between the first photoactive layer and the first electrode. The hole carrier layer can include a polymer selected from the group consisting of polythiophenes, polyanilines, polyvinylcarbazoles, polyphenylenes, polyphenylvinylenes, polysilanes, polythienylenevinylenes, polyisothianaphthanenes, and copolymers thereof.

In some embodiments, the system further includes a hole blocking layer between the second photoactive layer and the second electrode. The hole blocking layer can include a material selected from the group consisting of LiF, metal oxides, and combinations thereof.

In some embodiments, the system includes a tandem photovoltaic cell.

In some embodiments, the method further includes disposing the recombination layer onto a photoactive layer. The disposing can include disposing a first layer containing a first semiconductor material onto the photoactive layer and disposing a second layer containing a second semiconductor material different from the first semiconductor onto the first layer. In some embodiments, one of the first and second semiconductor materials is an n-type semiconductor material and the other of the first and second semiconductor materials is a p-type semiconductor material.

In some embodiments, the recombination layer is disposed on the photoactive layer using at least one process selected from the group consisting of solution coating, ink jet printing, spin coating, dip coating, knife coating, bar coating, spray coating, roller coating, slot coating, gravure coating, and screen printing.

Embodiments can provide one or more of the following advantages.

In some embodiments, the recombination layer can be prepared by using a solution process that can be readily used in a continuous roll-to-roll process. Such a process can significantly reduce the cost of preparing a photovoltaic cell.

In some embodiments, the photoactive layer can include a low band gap electron donor material, such as a polymer having an absorption wavelength at the red and near IR regions (e.g., 650-800 nm) of the electromagnetic spectrum, which is not accessible by most other conventional polymers. When such a polymer is incorporated into a photovoltaic cell together with a conventional polymer, it enables the cell to absorb the light in this region of the spectrum, thereby increasing the current and efficiency of the cell.

In some embodiments, the first and second photoactive layers have different band gaps. Thus, light not absorbed by one photoactive layer can be absorbed by another photoactive layer, thereby increasing the efficiency of the photovoltaic cell.

The details of one or more embodiments of the invention are set forth in the accompanying drawings and the description below. Other features and advantages of the invention will be apparent from the description and drawings, and from the claims.

DESCRIPTION OF DRAWINGS

FIG. 2 is an elevational view of an embodiment of a mesh electrode.

FIG. 3 is a cross-sectional view of the mesh electrode of FIG. 2.

Like reference symbols in the various drawings indicate like elements.

DETAILED DESCRIPTION

Figure 1:
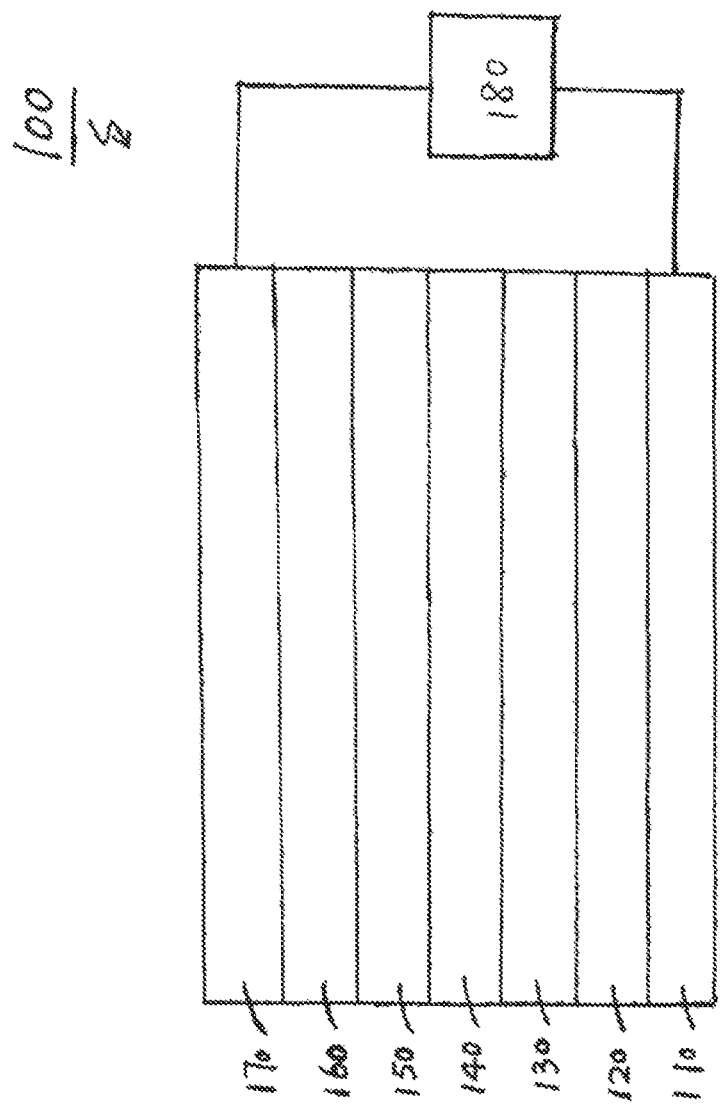
FIG. 1 is a cross-sectional view of an embodiment of a tandem photovoltaic cell.

FIG. 1 shows a tandem photovoltaic cell 100 having a cathode 110, a hole carrier layer 120, a photoactive layer 130, a recombination layer 140, a photoactive layer 150, a hole blocking layer 160, an anode 170, and an external load 180 connected to photovoltaic cell 100 via cathode 110 and anode 170.

In general, a recombination layer refers to a layer in a tandem cell where the electrons generated from a first cell recombine with the holes generated from a second cell. Recombination layer 140 typically includes a p-type semiconductor material and an n-type semiconductor material. In general, n-type semiconductor materials selectively transport electrons and p-type semiconductor materials selectively transport holes. As a result, electrons generated from the first cell recombine with holes generated from the second cell at the interface of the n-type and p-type semiconductor materials.

In some embodiments, the p-type semiconductor material includes a polymer and/or a metal oxide. Examples p-type semiconductor polymers include polythiophenes (e.g., poly (3,4-ethylene dioxythiophene) (PEDOT)), polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly(dithienothiophene oxide)s, polytetrahydroisoindoles, and copolymers thereof. The metal oxide can be an intrinsic p-type semiconductor (e.g., copper oxides, strontium copper oxides, or strontium titanium oxides) or a metal oxide that forms a p-type semiconductor after doping with a dopant (e.g., p-doped zinc oxides or p-doped titanium oxides). Examples of dopants includes salts or acids of fluoride, chloride, bromide, and iodide. In some embodiments, the metal oxide can be used in the form of nanoparticles.

In some embodiments, the n-type semiconductor material includes a metal oxide, such as titanium oxides, zinc oxides, tungsten oxides, molybdenum oxides, and combinations thereof. The metal oxide can be used in the form of nanoparticles. In other embodiments, the n-type semiconductor material includes a material selected from the group consisting of fullerenes, inorganic nanoparticles, oxadiazoles, discotic liquid crystals, carbon nanorods, inorganic nanorods, polymers containing CN groups, polymers containing $CF_3$ groups, and combinations thereof.

In some embodiments, the p-type and n-type semiconductor materials are blended into one layer. In certain embodiments, the recombination layer includes two layers, one layer including the p-type semiconductor material and the other layer including the n-type semiconductor material.

In some embodiments, recombination layer 140 includes at least about 30 wt % (e.g., at least about 40 wt % or at least about 50 wt %) and/or at most about 70 wt % (e.g., at most about 60 wt % or at most about 50 wt %) of the p-type semiconductor material. In some embodiments, recombination layer 140 includes at least about 30 wt % (e.g., at least about 40 wt % or at least about 50 wt %) and/or at most about 70 wt % (e.g., at most about 60 wt % or at most about 50 wt %) of the n-type semiconductor material.

Recombination layer 140 generally has a sufficient thickness so that the layers underneath are protected from any solvent applied onto recombination layer 140. In some embodiments, recombination layer 140 can have a thickness at least about 10 nm (e.g., at least about 20 nm, at least about 50 nm, or at least about 100 nm) and/or at most about 500 nm (e.g., at most about 200 nm, at most about 150 nm, or at most about 100 nm).

In general, recombination layer 140 is substantially transparent. For example, at the thickness used in a tandem photovoltaic cell 100, recombination layer 140 can transmit at least about 70% (e.g., at least about 75%, at least about 80%, at least about 85%, or at least about 90%) of incident light at a wavelength or a range of wavelengths (e.g., from about 350 nm to about 1,000 nm) used during operation of the photovoltaic cell.

Recombination layer 140 generally has a sufficiently low resistivity. In some embodiments, recombination layer 140 has a resistivity of at most about $1 \times 10^5$ ohm/square, (e.g., at most about $2 \times 10^5$ ohm/square, at most about $5 \times 10^5$ ohm/square, or at most about $1 \times 10^6$ ohm/square).

Without wishing to be bound by theory, it is believed that recombination layer 140 can be considered as a common electrode between two sub-cells (one including cathode 110, hole carrier layer 120, and photoactive layer 130, and the other include photoactive layer 150, hole blocking layer 160, and anode 170) in photovoltaic cells 100.

Cathode 110 is generally formed of an electrically conductive material. Examples of electrically conductive materials include electrically conductive metals, electrically conductive alloys, and electrically conductive polymers. Exemplary electrically conductive metals include gold, silver, copper, aluminum, nickel, palladium, platinum and titanium. Exemplary electrically conductive alloys include stainless steel (e.g., 332 stainless steel, 316 stainless steel), alloys of gold, alloys of silver, alloys of copper, alloys of aluminum, alloys of nickel, alloys of palladium, alloys of platinum and alloys of titanium. Exemplary electrically conducting polymers include polythiophenes (e.g., PEDOT), polyanilines (e.g., doped polyanilines), polypyrroles (e.g., doped polypyrroles). In some embodiments, combinations of electrically conductive materials are used.

In some embodiments, cathode 110 can include a mesh electrode. Examples of mesh electrodes are described in commonly owned co-pending U.S. Patent Application Publication Nos. 20040187911 and 20060090791, the contents of which are hereby incorporated by reference.

FIGS. 2 and 3 shows a mesh cathode 110 that includes solid regions 112 and open regions 114. In general, regions 112 are formed of electrically conducting material so that mesh cathode 110 can allow light to pass therethrough via, regions 114 and conduct electrons via regions 112.

The area of mesh cathode 110 occupied by open regions 114 (the open area of mesh cathode 110) can be selected as desired. Generally, the open area of mesh cathode 110 is at least about 10% (e.g., at least about 20%, at least about 30%, at least about 40%, at least about 50%, at least about 60%, at least about 70%, at least about 80%) and/or at most about 99% (e.g., at most about 95%, at most about 90%, at most about 85%) of the total area of mesh cathode 110.

Mesh cathode 110 can be prepared in various ways. In some embodiments, mesh cathode 110 is a woven mesh formed by weaving wires of material that form solid regions 112. The wires can be woven using, for example, a plain weave, a Dutch, weave, a twill weave, a Dutch twill weave, or combinations thereof. In certain embodiments, mesh cathode 110 is formed of a welded wire mesh. In some embodiments, mesh cathode 110 is an expanded mesh formed. An expanded metal mesh can be prepared, for example, by removing regions 114 (e.g., via laser removal, via chemical etching, via puncturing) from a sheet of material (e.g., an electrically conductive material, such as a metal), followed by stretching the sheet (e.g., stretching the sheet in two dimensions). In certain embodiments, mesh cathode 110 is a metal sheet formed by removing regions 114 (e.g., via, laser removal, via chemical etching, via, puncturing) without subsequently stretching the sheet.

In certain embodiments, solid regions 112 are formed entirely of an electrically conductive material (e.g., regions 112 are formed of a substantially homogeneous material that is electrically conductive), such as those described above. In some embodiments, solid regions 112 can have a resistivity less than about 3 ohm per square.

In some embodiments, solid regions 112 are formed of a first material that is coated with a second material different from the first material (e.g., using metallization, using vapor deposition). In general, the first material can be formed of any desired material (e.g., an electrically insulative material, an electrically conductive material, or a semiconductive material), and the second material is an electrically conductive material. Examples of electrically insulative material from which the first material can be formed include textiles, optical fiber materials, polymeric materials (e.g., a nylon) and natural materials (e.g., flax, cotton, wool, silk). Examples of electrically conductive materials from which the first material can be formed include the electrically conductive materials disclosed above. Examples of semiconductive materials from which the first material can be formed include indium tin oxide, fluorinated tin oxide, tin oxide and zinc oxide. In some embodiments, the first material is in the form of a fiber, and the second material is an electrically conductive material that is coated on the first material. In certain embodiments, the first material is in the form of a mesh (see discussion above) that, after being formed into a mesh, is coated with the second material. As an example, the first material can be an expanded metal mesh, and the second material can be PEDOT that is coated on the expanded metal mesh.

Generally, the maximum thickness of mesh cathode 110 should be less than the total thickness of hole carrier layer 120. Typically, the maximum thickness of mesh cathode 110 is at least 0.1 micron (e.g., at least about 0.2 micron, at least about 0.3 micron, at least about 0.4 micron, at least about 0.5 micron, at least about 0.6 micron, at least about 0.7 micron, at least about 0.8 micron, at least about 0.9 micron, at least about one micron) and/or at most about 10 microns (e.g., at most about nine microns, at most about eight microns, at most about seven microns, at most about six microns, at most about five microns, at most about four microns, at most about three microns, at most about two microns).

While shown in FIG. 2 as having a rectangular shape, open regions 114 can generally have any desired shape (e.g., square, circle, semicircle, triangle, diamond, ellipse, trapezoid, irregular shape). In some embodiments, different open regions 114 in mesh cathode 110 can have different shapes.

Although shown in FIG. 3 as having square cross-sectional shape, solid regions 112 can generally have any desired shape (e.g., rectangle, circle, semicircle, triangle, diamond, ellipse, trapezoid, irregular shape). In some embodiments, different solid regions 112 in mesh cathode 110 can have different shapes. In embodiments where solid regions 112 have a circular cross-section, the cross-section can have a diameter in the range of about 5 microns to about 200 microns. In embodiments where solid regions 112 have a trapezoid cross-section, the cross-section can have a height in the range of about 0.1 micron to about 5 microns and a width in the range of about 5 microns to about 200 microns.

In some embodiments, mesh cathode 110 is flexible (e.g., sufficiently flexible to be incorporated in photovoltaic cell 100 using a continuous, roll-to-roll manufacturing process). In certain embodiments, mesh cathode 110 is semi-rigid or inflexible. In some embodiments, different regions of mesh cathode 110 can be flexible, semi-rigid or inflexible (e.g., one or more regions flexible and one or more different regions semi-rigid, one or more regions flexible and one or more different regions inflexible).

In general, mesh electrode 110 can be disposed on a substrate. In some embodiments, mesh electrode 110 can be partially embedded in the substrate.

Hole carrier layer 120 is generally formed of a material that, at the thickness used in photovoltaic cell 100, transports holes to cathode 110 and substantially blocks the transport of electrons to cathode 110. Examples of materials from which layer 120 can be formed include polythiophenes (e.g., PEDOT), polyanilines, polyvinylcarbazoles, polyphenylenes, polyphenylvinylenes, polysilanes, polythienylenevinylenes, polyisothianaphthanenes, and copolymers thereof. In some embodiments, hole carrier layer 120 can include combinations of hole carrier materials.

In general, the thickness of hole carrier layer 120 (i.e., the distance between the surface of hole carrier layer 120 in contact with first photoactive layer 130 and the surface of cathode 110 in contact with hole carrier layer 120) can be varied as desired. Typically, the thickness of hole carrier layer 120 is at least 0.01 micron (e.g., at least about 0.05 micron, at least about 0.1 micron, at least about 0.2 micron, at least about 0.3 micron, or at least about 0.5 micron) and/or at most about five microns (e.g., at most about three microns, at most about two microns, or at most about one micron). In some embodiments, the thickness of hole carrier layer 120 is from about 0.01 micron to about 0.5 micron.

Each of photoactive layers 130 and 150 generally contains an electron acceptor material and an electron donor material. Examples of electron acceptor materials include fullerenes, oxadiazoles, carbon nanorods, discotic liquid crystals, inorganic nanoparticles (e.g., nanoparticles formed of zinc oxide, tungsten oxide, indium phosphide, cadmium selenide and/or lead sulphide), inorganic nanorods (e.g., nanorods formed of zinc oxide, tungsten oxide, indium phosphide, cadmium selenide and/or lead sulphide), or polymers containing moieties capable of accepting electrons or forming stable anions (e.g., polymers containing CN groups, polymers containing $CF_3$ groups). In some embodiments, the electron acceptor material is a substituted fullerene (e.g., PCBM). In some embodiments, a combination of electron acceptor materials can be used in photoactive layer 130 or 150.

Examples of electron donor materials include conjugated polymers, such as polythiophenes, polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxalines, polybenzoisothiazoles, polybenzothiazoles, polythienothiophenes, poly(thienothiophene oxide)s, polydithienothiophenes, poly(dithienothiophene oxide)s, polytetrahydroisoindoles, and copolymers thereof. In some embodiments, the electron donor material can be polythiophenes (e.g., poly(3-hexylthiophene)), polycyclopentadithiophenes, and copolymers thereof. In certain embodiments, a combination of electron donor materials can be used in photoactive layer 130 or 150.

In some embodiments, the electron donor materials or the electron acceptor materials can include a polymer having a first comonomer repeat unit and a second comonomer repeat unit different from the first comonomer repeat unit. The first comonomer repeat unit can include a cyclopentadithiophene moiety, a silacyclopentadithiophene moiety, a cyclopentadithiazole moiety, a thiazolothiazole moiety, a thiazole moiety, a benzothiadiazole moiety, a thiophene oxide moiety, a cyclopentadithiophene oxide moiety, a polythiadiazoloquinoxaline moiety, a benzoisothiazole moiety, a benzothiazole moiety, a thienothiophene moiety, a thienothiophene oxide moiety, a dithienothiophene moiety, a dithienothiophene oxide moiety, or a tetrahydroisoindoles moiety.

In some embodiments, the first comonomer repeat unit includes a cyclopentadithiophene moiety. In some embodiments, the cyclopentadithiophene moiety is substituted with at least one substituent selected from the group consisting of $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, and $SO_2R$; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. For example, the cyclopentadithiophene moiety can be substituted with hexyl, 2-ethylhexyl, or 3,7-dimethyloctyl. In certain embodiments, the cyclopentadithiophene moiety is substituted at 4-position. In some embodiments, the first comonomer repeat unit can include a cyclopentadithiophene moiety of formula (1):

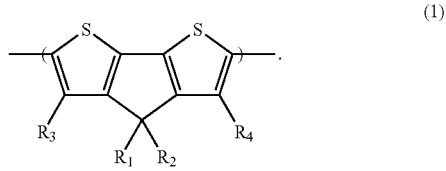

(1)

In formula (1), each of H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$; R being H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl. For example, each of $R_1$ and $R_2$, independently, can be hexyl, 2-ethylhexyl, or 3,7-dimethyloctyl.

An alkyl can be saturated or unsaturated and branch or straight chained. A $C_1$-$C_{20}$ alkyl contains 1 to 20 carbon atoms (e.g., one, two, three, four, five, six, seven, eight, nine, 10, 11, 12, 13, 14, 15, 16, 17, 18, 19, and 20 carbon atoms). Examples of alkyl moieties include —$CH_3$, —$CH_2$—, —CH=$CH_2$—, —$CH_2$—CH=$CH_2$, and branched —$C_3H_7$. An alkoxy can be branch or straight chained and saturated or unsaturated. An $C_1$-$C_{20}$ alkoxy contains an oxygen radical and 1 to 20 carbon atoms (e.g., one, two, three, four, five, six, seven, eight, nine, 10, 11, 12, 13, 14, 15, 16, 17, 18, 19, and 20 carbon atoms). Examples of alkoxy moieties include —$OCH_3$ and —OCH=CH—$CH_3$. A cycloalkyl can be either saturated or unsaturated. A $C_3$-$C_{20}$ cycloalkyl contains 3 to 20 carbon atoms (e.g., three, four, five, six, seven, eight, nine, 10, 11, 12, 13, 14, 15, 16, 17, 18, 19, and 20 carbon atoms). Examples of cycloalkyl moieties include cyclohexyl and cyclohexen-3-yl. A heterocycloalkyl can also be either saturated or unsaturated. A $C_3$-$C_{20}$ heterocycloalkyl contains at least one ring heteroatom (e.g., O, N, and S) and 3 to 20 carbon atoms (e.g., three, four, five, six, seven, eight, nine, 10, 11, 12, 13, 14, 15, 16, 17, 18, 19, and 20 carbon atoms). Examples of heterocycloalkyl moieties include 4-tetrahydropyranyl and 4-pyranyl. An aryl can contain one or more aromatic rings. Examples of aryl moieties include phenyl, phenylene, naphthyl, naphthylene, pyrenyl, anthryl, and phenanthryl. A heteroaryl can contain one or more aromatic rings, at least one of which contains at least one ring heteroatom (e.g., O, N, and S). Examples of heteroaryl moieties include furyl, furylene, fluorenyl, pyrrolyl, thienyl, oxazolyl, imidazolyl, thiazolyl, pyridyl, pyrimidinyl, quinazolinyl, quinolyl, isoquinolyl, and indolyl.

Alkyl, alkoxy, cycloalkyl, heterocycloalkyl, aryl, and heteroaryl mentioned herein include both substituted and unsubstituted moieties, unless specified otherwise. Examples of substituents on cycloalkyl, heterocycloalkyl, aryl, and heteroaryl include $C_1$-$C_{20}$ alkyl, $C_3$-$C_{20}$ cycloalkyl, $C_1$-$C_{20}$ alkoxy, aryl, aryloxy, heteroaryl, heteroaryloxy, amino, $C_1$-$C_{10}$ alkylamino, $C_1$-$C_{20}$ dialkylamino, arylamino, diarylamino, diarylamino, hydroxyl, halogen, thio, $C_1$-$C_{10}$ alkylthio, arylthio, $C_1$-$C_{10}$ alkylsulfonyl, arylsulfonyl, cyano, nitro, acyl, acyloxy, carboxyl, and carboxylic ester. Examples of substituents on alkyl include all of the above-recited substituents except $C_1$-$C_{20}$ alkyl. Cycloalkyl, heterocycloalkyl, aryl, and heteroaryl also include fused groups.

The second comonomer repeat unit can include a benzothiadiazole moiety, a thiadiazoloquinoxaline moiety, a cyclopentadithiophene oxide moiety, a benzoisothiazole moiety, a benzothiazole moiety, a thiophene oxide moiety, a thienothiophene moiety, a thienothiophene oxide moiety, a dithienothiophene moiety, a dithienothiophene oxide moiety, a tetrahydroisoindole moiety, a fluorene moiety, a silole moiety, a cyclopentadithiophene moiety, a fluorenone moiety, a thiazole moiety, a selenophene moiety, a thiazolothiazole moiety, a cyclopentadithiazole moiety, a naphthothiadiazole moiety, a thienopyrazine moiety, a silacyclopentadithiophene moiety, an oxazole moiety, an imidazole moiety, a pyrimidine moiety, a benzoxazole moiety, or a benzimidazole moiety. In some embodiments, the second comonomer repeat unit is a 3,4-benzo-1,2,5-thiadiazole moiety.

In some embodiments, the second comonomer repeat unit can include a benzothiadiazole moiety of formula (2), a thiadiazoloquinoxaline moiety of formula (3), a cyclopentadithiophene dioxide moiety of formula (4), a cyclopentadithiophene monoxide moiety of formula (5), a benzoisothiazole moiety of formula (6), a benzothiazole moiety of formula (7), a thiophene dioxide moiety of formula (8), a cyclopentadithiophene dioxide moiety of formula (9), a cyclopentadithiophene tetraoxide moiety of formula (10), a thienothiophene moiety of formula (11), a thienothiophene tetraoxide moiety of formula (12), a dithienothiophene moiety of formula (13), a dithienothiophene dioxide moiety of formula (14), a dithienothiophene tetraoxide moiety of formula (15), a tetrahydroisoindole moiety of formula (16), a thienothiophene dioxide moiety of formula (17), a dithienothiophene dioxide moiety of formula (18), a fluorene moiety of formula (19), a silole moiety of formula (20), a cyclopentadithiophene moiety of formula (21), a fluorenone moiety of formula (22), a thiazole moiety of formula (23), a selenophene moiety of formula (24), a thiazolothiazole moiety of formula (25), a cyclopentadithiazole moiety of formula (26), a naphthothiadiazole moiety of formula (27), a thienopyrazine moiety of formula (28), a silacyclopentadithiophene moiety of formula (29), an oxazole moiety of formula (30), an imidazole moiety of formula (31), a pyrimidine moiety of formula (32), a benzoxazole moiety of formula (33), or a benzimidazole moiety of formula (34):

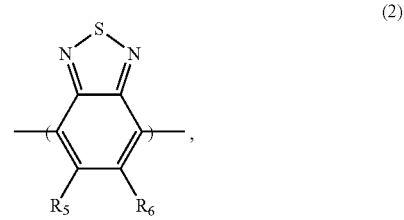

(2)

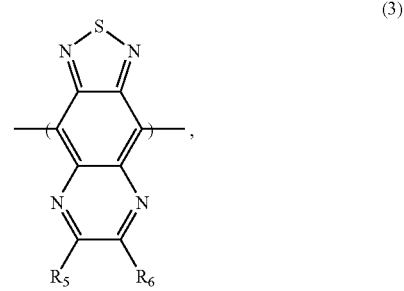

(3)

-continued
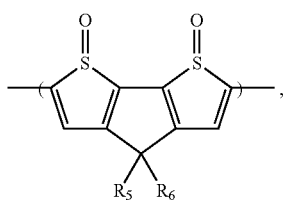(4)
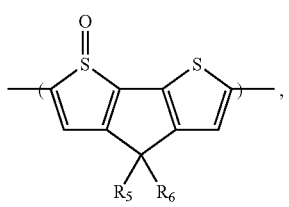(5)
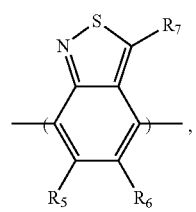(6)
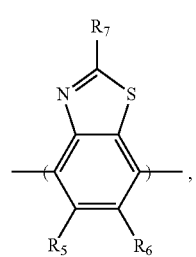(7)
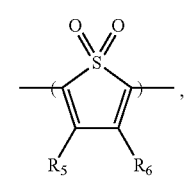(8)
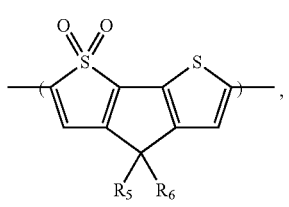(9)
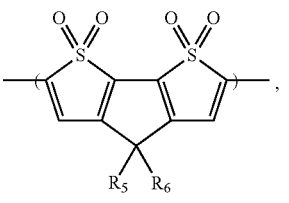(10)
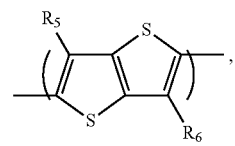(11)
-continued
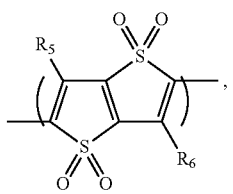(12)
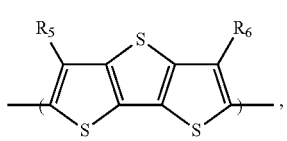(13)
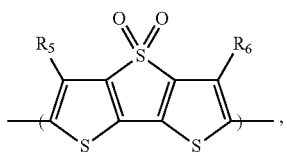(14)
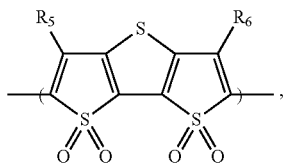(15)
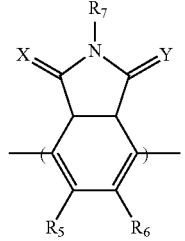(16)
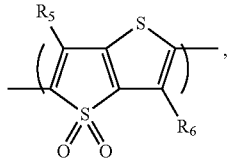(17)
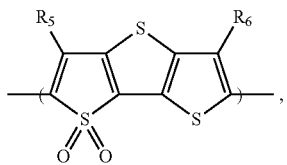(18)
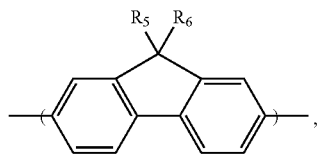(19)
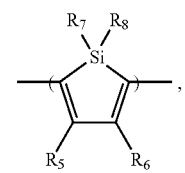(20)

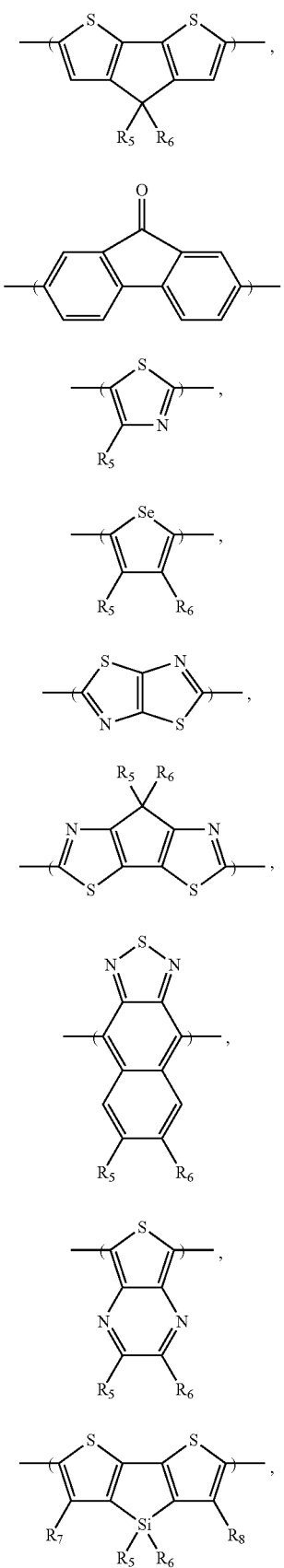

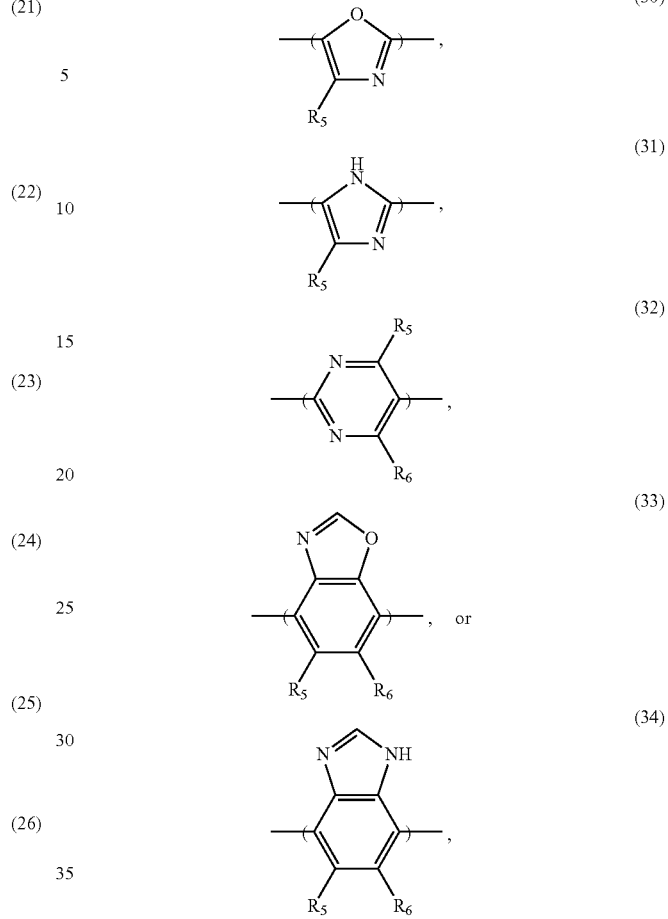

In the above formulas, each of X and Y, independently, is $CH_2$, O, or S; each of $R_5$ and $R_6$, independently, is H, $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, halo, CN, OR, C(O)R, C(O)OR, or $SO_2R$, in which R is H, $C_1$-$C_{20}$ alkyl, $C_1$-$C_{20}$ alkoxy, aryl, heteroaryl, $C_3$-$C_{20}$ cycloalkyl, or $C_1$-$C_{20}$ heterocycloalkyl; and each of $R_7$ and $R_8$, independently, is H, $C_1$-$C_{20}$ alkyl, $C_1$-$C_{20}$ alkoxy, aryl, heteroaryl, $C_3$-$C_{20}$ cycloalkyl, or $C_3$-$C_{20}$ heterocycloalkyl. In some embodiments, the second comonomer repeat unit includes a benzothiadiazole moiety of formula (2), in which each of $R_5$ and $R_6$ is H.

The second comonomer repeat unit can include at least three thiophene moieties. In some embodiments, at least one of the thiophene moieties is substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl. In certain embodiments, the second comonomer repeat unit includes five thiophene moieties.

The polymer can further include a third comonomer repeat unit that contains a thiophene moiety or a fluorene moiety. In some embodiments, the thiophene or fluorene moiety is substituted with at least one substituent selected from the group consisting of $C_1$-$C_{20}$ alkyl, $C_1$-$C_{20}$ alkoxy, aryl, heteroaryl, $C_3$-$C_{20}$ cycloalkyl, and $C_3$-$C_{20}$ heterocycloalkyl.

In some embodiments, the polymer can be formed by any combination of the first, second, and third comonomer repeat units. In certain embodiments, the polymer can be a homopolymer containing any of the first, second, and third comonomer repeat units.

In some embodiments, the polymer can be

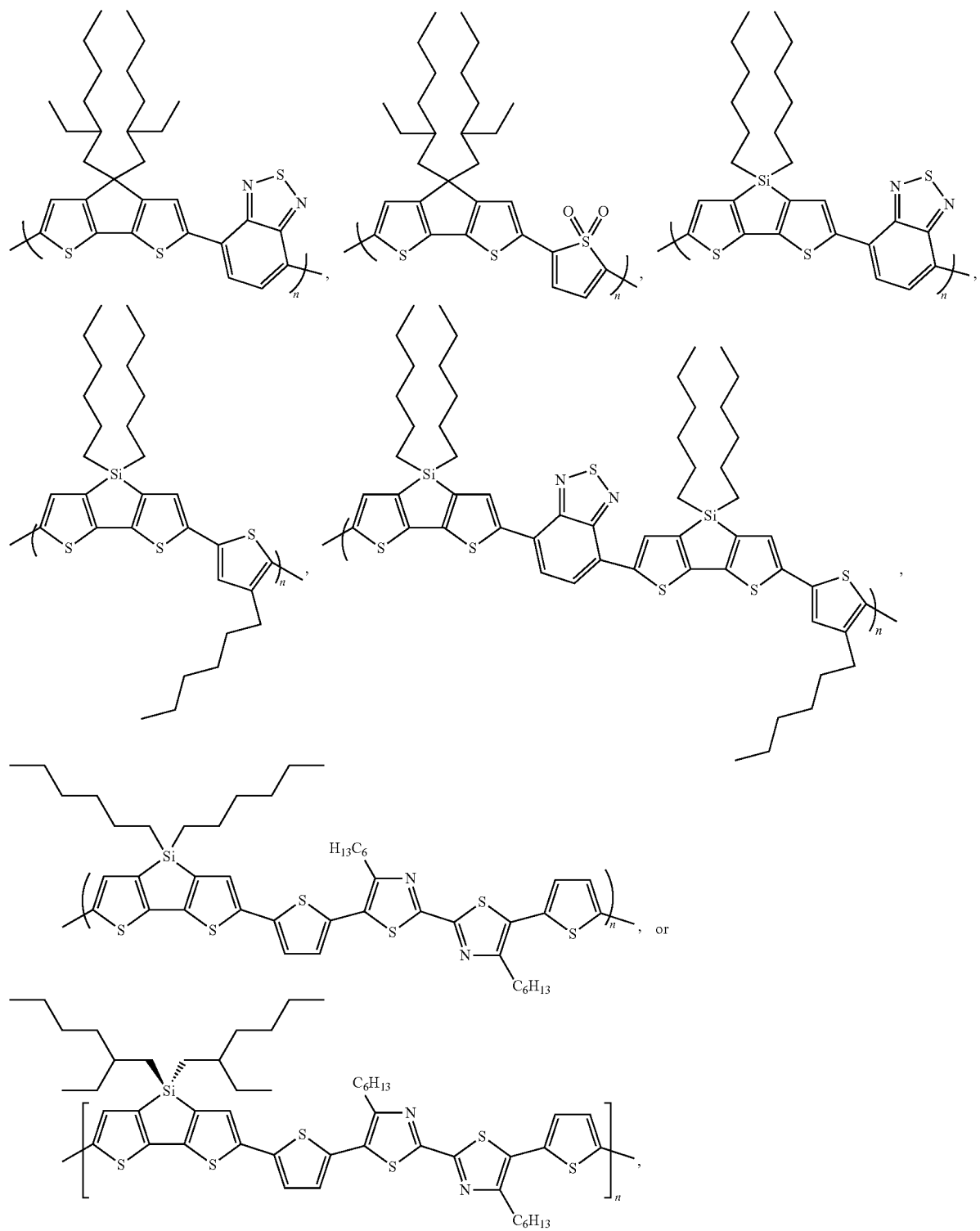

in which n can be an integer greater than 1.

The monomers for preparing the polymers mentioned herein may contain a non-aromatic double bond and one or more asymmetric centers. Thus, they can occur as racemates and racemic mixtures, single enantiomers, individual diastereomers, diastereomeric mixtures, and cis- or trans-isomeric forms. All such isomeric forms are contemplated.

The polymers described above can be prepared by methods known in the art, such as those described in commonly owned co-pending U.S. application Ser. No. 11/601,374, the contents of which are hereby incorporated by reference. For example, a copolymer can be prepared by a cross-coupling reaction between one or more comonomers containing two alkylstannyl groups and one or more comonomers containing two halo groups in the presence of a transition metal catalyst. As another example, a copolymer can be prepared by a cross-coupling reaction between one or more comonomers containing two borate groups and one or more comonomers containing two halo groups in the presence of a transition metal catalyst. The comonomers can be prepared by the methods described herein or by the methods know in the art, such as those described in U.S. patent application Ser. No. 11/486,536, Coppo et al., *Macromolecules* 2003, 36, 2705-2711 and Kurt et al., *J. Heterocycl. Chem.* 1970, 6, 629, the contents of which are hereby incorporated by reference.

Without wishing to be bound by theory, it is believed that an advantage of the polymers described above is that their absorption wavelengths shift toward the red and near IR regions (e.g., 650-800 nm) of the electromagnetic spectrum, which is not accessible by most other conventional polymers. When such a polymer is incorporated into a photovoltaic cell together with a conventional polymer, it enables the cell to absorb the light in this region of the spectrum, thereby increasing the current and efficiency of the cell.

In some embodiments, photoactive layer 130 has a first band gap and photoactive layer 150 has a second band gap different from the first band gap. In such embodiments, light not absorbed by one photoactive layer can be absorbed by another photoactive layer, thereby increasing the efficiency of photovoltaic cell 100.

Generally, photoactive layer 130 or 150 is sufficiently thick to be relatively efficient at absorbing photons impinging thereon to form corresponding electrons and holes, and sufficiently thin to be relatively efficient at transporting the holes and electrons. In certain embodiments, photoactive layer 130 or 150 is at least 0.05 micron (e.g., at least about 0.1 micron, at least about 0.2 micron, at least about 0.3 micron) thick and/or at most about one micron (e.g., at most about 0.5 micron, at most about 0.4 micron) thick. In some embodiments, photoactive layer 130 or 150 is from about 0.1 micron to about 0.2 micron thick.

In general, photoactive layer 130 or 150 can be formed by using a suitable process, such as solution coating, ink jet printing, spin coating, dip coating, knife coating, bar coating, spray coating, roller coating, slot coating, gravure coating, or screen printing.

Hole blocking layer 160 is generally formed of a material that, at the thickness used in photovoltaic cell 100, transports electrons to anode 170 and substantially blocks the transport of holes to anode 170. Examples of materials from which hole blocking layer 160 can be formed include LiF and metal oxides (e.g., zinc oxide, titanium oxide).

Typically, hole blocking layer 160 is at least 0.02 micron (e.g., at least about 0.03 micron, at least about 0.04 micron, at least about 0.05 micron) thick and/or at most about 0.5 micron (e.g., at most about 0.4 micron, at most about 0.3 micron, at most about 0.2 micron, at most about 0.1 micron) thick.

Anode 170 is generally formed of an electrically conductive material, such as one or more of the electrically conductive materials noted above. In some embodiments, anode 170 is formed of a combination of electrically conductive materials. In certain embodiments, anode 170 can be formed of a mesh electrode.

Without wishing to be bound by theory, it is believed that tandem photovoltaic cell 100 achieves the highest efficiency when photoactive layers 130 and 150 generate substantially the same amount of current.

Figure 4:
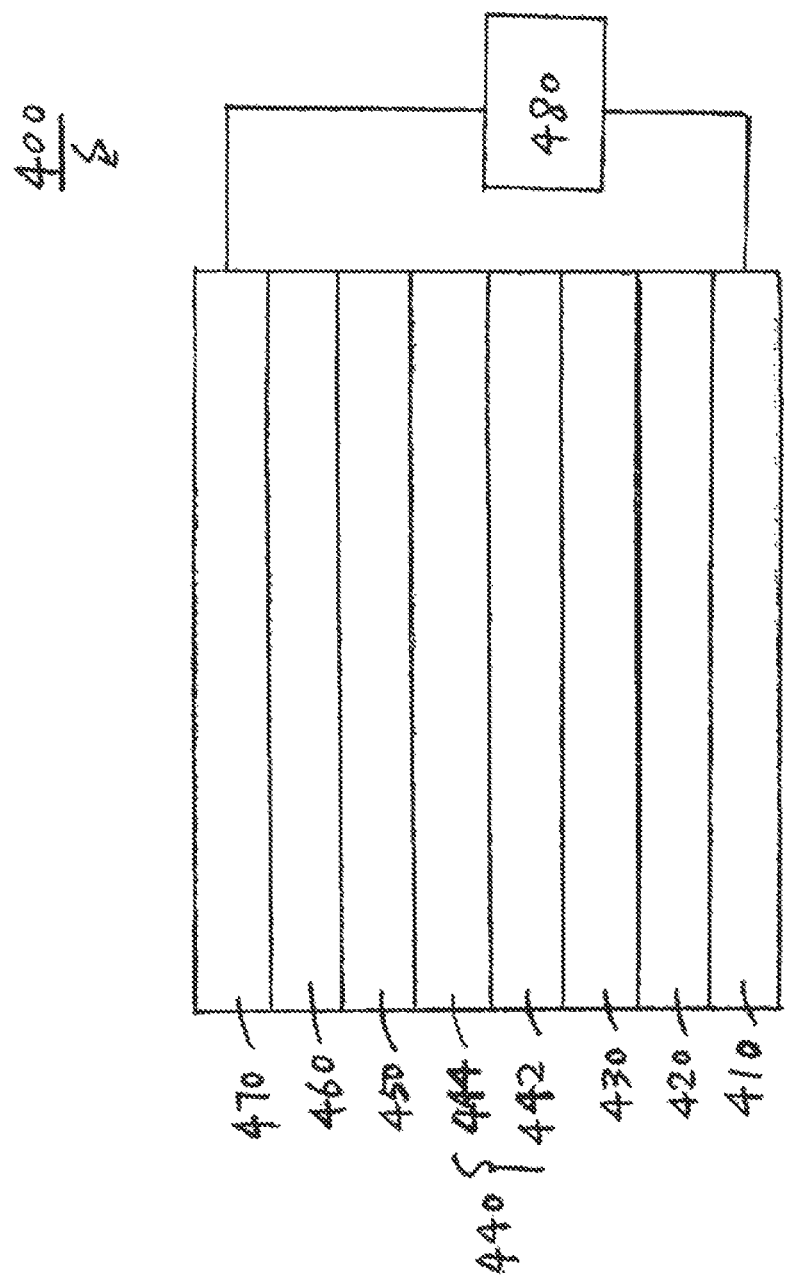
FIG. 4 is a cross-sectional view of another embodiment of a tandem photovoltaic cell.

FIG. 4 shows a tandem photovoltaic cell 400 having a cathode 410, a hole carrier layer 420, a photoactive layer 430, a recombination layer 440, a photoactive layer 450, a hole blocking layer 460, an anode 470, and an external load 480 connected to photovoltaic cell 400 via cathode 410 and anode 470. Recombination layer 440 includes a layer 442 that contains an an-type semiconductor material and a layer 444 that contains a p-type semiconductor material. In some embodiments, recombination layer 440 can include a layer of mixed n-type and p-type semiconductor material at the interface of layer 442 and layer 444.

In some embodiments, a two-layer recombination layer can be prepared by applying a layer of an n-type semiconductor material and a layer of a p-type semiconductor material separately. For example, when titanium oxide nanoparticles are used as an n-type semiconductor material, a layer of titanium oxide nanoparticles can be formed by (1) dispersing a precursor (e.g., a titanium salt) in a solvent (e.g., an anhydrous alcohol) to form a dispersion, (2) coating the dispersion on a photoactive layer, (3) hydrolyzing the dispersion to form a titanium oxide layer, and (4) drying the titanium oxide layer. As another example, when a polymer (e.g., PEDOT) is used a p-type semiconductor, a polymer layer can be formed by first dissolving the polymer in a solvent (e.g., an anhydrous alcohol) to form a solution and then coating the solution on a photoactive layer. In some embodiments, a one-layer recombination layer can be prepared by applying a blend of an n-type semiconductor material and a p-type semiconductor material on photoactive layer. For example, an n-type semiconductor and a p-type semiconductor can be first dispersed and/or dissolved in a solvent together to form a dispersion or solution and then coated the dispersion or solution on a photoactive layer to form a recombination layer. The coating process mentioned above can be achieved by using at least one process selected from the group consisting of solution coating, ink jet printing, spin coating, dip coating, knife coating, bar coating, spray coating, roller coating, slot coating, gravure coating, and screen printing.

Without wishing to bound by theory, it is believed that the solution process described above can be readily used in a continuous manufacturing process, such as a roll-to-roll process, thereby significantly reducing the cost of preparing a photovoltaic cell. Examples of roll-to-roll processes have been described in, for example, U.S. Application Publication No. 2005-0263179.

The following examples are illustrative and not intended to be limiting.

Example 1

A tandem photovoltaic cell having the structure of ITO/TIO$_2$/P3HT:PCBM/PEDOT/TiO2/P3HT:PCBM/PEDOT/Ag was prepared as follows. A substrate with ITO (having a resistivity of 13 ohm/square) was cleaned sequentially with acetone and isopropanol for 10 minutes in an ultrasonic bath at room temperature. Tetra-n-butyl-titanate (TYZOR; E. I. du Pont de Nemours and Company, Wilmington, Del.) diluted 1:199 in anhydrous isopropanol was applied onto the ITO via doctor-blading (40 mm/s; 600 μm slot at 40° C.) and hydrolyzed by distilled water. The coating thus obtained was dried for 10 minutes to give a titanium oxide layer having a thickness of 10±5 nm. A solution of poly-(3-hexylthiophen) (P3HT):C61-phenyl-butyric acid methyl ester (PCBM) in ortho-xylene (1.5 mg:1.2 mg:100 μl) was then applied onto the titanium oxide layer via doctor-blading (7.5 minis; 600 mm slot at 65° C.) to give a P3HT:PCBM layer having a thickness of 100±10 nm. A solution of PEDOT in isopropanol (1 ml:5 ml) was subsequently coated on the P3HT:PCBM layer via doctor-blading (2×5 mm/s; 150 µm slot at 85° C.) to give in a PEDOT layer of 30±10 mm. After the device thus obtained was baked for 10 minutes at 140° C. In nitrogen atmosphere, tetra-n-butyl-titanate diluted 1:199 in anhydrous isopropanol was applied onto the PEDOT layer via doctor-blading (40 mm/s; 600 µm slot at 40° C.). The coating was hydrolyzed and dried for 10 minutes to give a second titanium oxide layer of 10±5 nm. The PEDOT layer and the second titanium oxide layer obtained above constituted as the recombination layer in the final tandem photovoltaic cell. A solution of P3HT:PCBM in ortho-xylene (1.5 mg:1.2 mg:100 µl) was then applied onto the second titanium oxide layer via doctor-blading (65 mm/s; 600 µm slot at 65° C.) to give a second P3HT:PCBM layer having a thickness of 300±30 nm. Subsequently, a solution of PEDOT in isopropanol (1 ml:5 ml) was applied onto the second P3HT:PCBM layer via doctor-blading (2×5 mm/s; 150 µm slot at 85° C.) to give a second PEDOT layer having a thickness of 30±10 nm. After the device thus obtained was baked for 20 minutes at 140° C. in nitrogen atmosphere, a 100 nm layer of silver was applied onto the second PEDOT layer via thermal evaporation (0.05-0.5 nm/s at 3×10.6$^{-6}$ mbar) to give a tandem photovoltaic cell.

A single photovoltaic cell having the structure of ITO/TiO$_2$/P3HT:PCBM/PEDOT/Ag was also prepared. The titanium oxide layer, the P3HT:PCBM layer, the PEDOT layer, and the silver layer were prepared using the same methods described in the preceding paragraph.

The tandem photovoltaic cell and single cell were tested for their properties. The open circuit voltage of both cells were measured at zero current using a Source Measurement Unit (SMU) Keithley 2400 when the device was illuminated by a solar simulator (Oriel) at 1 kW/m$^2$ Air Mass 1.5 global. The results show that the open circuit voltage of the tandem photovoltaic cell was 1.025, twice as much as that of a single photovoltaic cell having the structure of ITO/TiO$_2$P3H:PCBM/PEDOT/Ag.

Other embodiments are in the claims.

What is claimed is:

1. An article, comprising:
    first and second electrodes;
    a recombination layer between the first and second electrodes, the recombination layer comprising a p-type semiconductor material and an n-type semiconductor material, and having a thickness of about 10 nm to about 200 nm;
    a first photoactive layer between the first electrode and the recombination layer; and
    a second photoactive layer between the second electrode and the recombination layer;
    wherein:
    the recombination layer is in direct contact with both the first photoactive layer and the second photoactive layer;
    the first photoactive layer and the second photoactive layer comprise an electron donor material and an electron acceptor material;
    the first photoactive layer and the second photoactive layer are single layers;
    the p-type semiconductor material comprises a polymer selected from the group consisting of polythiophenes, polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiazoloquinoxalines, polybenzoisothiazoles, polybenzothiazoles, polythienothiophenes, poly(thienothiophene oxide)s, polydithienothiophenes, poly(dithienothiophene oxide)s, polytetrahydroisoindoles, and copolymers thereof;
    the n-type semiconductor material comprises a metal oxide;
    the p-type and n-type semiconductor materials are blended in the recombination layer; and the article is configured as a photovoltaic system.

2. The article of claim 1, wherein the metal oxide comprises an oxide selected from the group consisting of titanium oxides, zinc oxides, tungsten oxides, molybdenum oxides, and combinations thereof.

3. The article of claim 1, wherein the electron donor material comprises a polymer selected from the group consisting of polythiophenes, polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly(dithienothiophene oxide)s, polytetrahydroisoindoles, and copolymers thereof.

4. The article of claim 3, wherein the electron donor material comprises a polymer selected from the group consisting of polythiophenes, polycyclopentadithiophenes, and copolymers thereof.

5. The article of claim 4, wherein the electron donor material comprises poly(3-hexylthiophene) or poly(cyclopentadithiophene-co-benzothiadiazole).

6. The article of claim 1, wherein the electron acceptor material comprises a material selected from the group consisting of fullerenes, inorganic nanoparticles, oxadiazoles, discotic liquid crystals, carbon nanorods, inorganic nanorods, polymers containing CN groups, polymers containing CF3 groups, and combinations thereof.

7. The article of claim 6, wherein the electron acceptor material comprises a substituted fullerene.

8. The article of claim 7, wherein the substituted fullerene comprises PCBM.

9. The article of claim 1, wherein the first photoactive layer has a first band gap and the second photoactive layer has a second band gap different from the first band gap.

10. The article of claim 1, further comprising a hole carrier layer between the first photoactive layer and the first electrode.

11. The article of claim 10, wherein the hole carrier layer comprises a polymer selected from the group consisting of polythiophenes, polyanilines, polyvinylcarbazoles, polyphenylenes, polyphenylvinylenes, polysilanes, polythienylenevinylenes, polyisothianaphthanenes, and copolymers thereof.

12. The article of claim 1, further comprising a hole blocking layer between the second photoactive layer and the second electrode.

13. The article of claim 12, wherein the hole blocking layer comprises a material selected from the group consisting of LiF, metal oxides, and combinations thereof.

14. The article of claim 1, wherein the system comprises a tandem photovoltaic cell.

15. An article, comprising:

first and second electrodes;

first and second photoactive layers between the first and second electrodes, the first photoactive layer comprising a first semiconductor material and the second photoactive layer comprising a second semiconductor material;

the first photoactive layer and the second photoactive layer comprise an electron donor material and an electron acceptor material;

the first photoactive layer and the second photoactive layer are single layers; and a recombination layer between and in direct contact with both the first and the second photoactive layers and having a thickness of about 10 nm to about 200 nm, the recombination layer comprising a p-type semiconductor material and an n-type semiconductor material, each of the p-type and n-type semiconductor materials is different from the first or second semiconductor material;

wherein:

the p-type semiconductor material comprises a polymer selected from the group consisting of polythiophenes, polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxalines, polybenzoisothiazoles, polybenzothiazoles, polythienothiophenes, poly(thienothiophene oxide)s, polydithienothiophenes, poly(dithienothiophene oxide)s, polytetrahydroisoindoles, and copolymers thereof;

the n-type semiconductor material comprises a metal oxide;

the p-type and n-type semiconductor materials are blended in the third layer;

the first photoactive layer comprises a first electron acceptor material and a first electron donor material;

the second photoactive layer comprises a second electron acceptor material and a second electron donor material; and the article is configured as a photovoltaic system.

16. The article of claim 15, wherein the first electron donor material comprises a polymer selected from the group consisting of polythiophenes, polyanilines, polyvinylcarbazoles, polyphenylenes, polyphenylvinylenes, polysilanes, polythienylenevinylenes, polyisothianaphthanenes, polycyclopentadithiophenes, polysilacyclopentadithiophenes, polycyclopentadithiazoles, polythiazolothiazoles, polythiazoles, polybenzothiadiazoles, poly(thiophene oxide)s, poly(cyclopentadithiophene oxide)s, polythiadiazoloquinoxaline, polybenzoisothiazole, polybenzothiazole, polythienothiophene, poly(thienothiophene oxide), polydithienothiophene, poly(dithienothiophene oxide)s, polytetrahydroisoindoles, and copolymers thereof.

17. The article of claim 15, wherein the first electron donor material comprises a polymer selected from the group consisting of polythiophenes, polycyclopentadithiophenes, and copolymers thereof.

18. The article of claim 15, wherein the first electron donor material comprises poly(3-hexylthiophene) or poly(cyclopentadithiophene-co-benzothiadiazole).

19. The article of claim 15, wherein the first electron acceptor material comprises a material selected from the group consisting of fullerenes, inorganic nanoparticles, oxadiazoles, discotic liquid crystals, carbon nanorods, inorganic nanorods, polymers containing CN groups, polymers containing CF3 groups, and combinations thereof.

20. The article of claim 15, wherein the first electron acceptor material comprises a substituted fullerene.

21. The article of claim 15, wherein the first electron acceptor material comprises PCBM.

22. The article of claim 15, wherein the first electron acceptor material is the same as the second electron acceptor material, and the first electron donor material is the same as the second electron donor material.

* * * * *

UNITED STATES PATENT AND TRADEMARK OFFICE
CERTIFICATE OF CORRECTION

PATENT NO. : 8,975,512 B2
APPLICATION NO. : 13/920486
DATED : March 10, 2015
INVENTOR(S) : Christoph Brabec et al.

It is certified that error appears in the above-identified patent and that said Letters Patent is hereby corrected as shown below:

In the Specification,

Column 2, line 65, insert --tungsten-- in front of the words "oxides, molybdenum oxides..."
Column 3, line 24, delete the word "polyzoisothiazole"
Column 3, line 24, replace the word "benzoisothiazole" with --polybenzoisothiazole--

Signed and Sealed this
Fourth Day of August, 2015

Michelle K. Lee
*Director of the United States Patent and Trademark Office*